US009481925B2

(12) United States Patent
O'Sullivan

(10) Patent No.: US 9,481,925 B2
(45) Date of Patent: Nov. 1, 2016

(54) TITANIUM DIBORIDE TARGET

(75) Inventor: Michael O'Sullivan, Ehenbichl (AT)

(73) Assignee: Plansee SE, Reutte (AT)

( * ) Notice: Subject to any disclaimer, the term of this patent is extended or adjusted under 35 U.S.C. 154(b) by 1032 days.

(21) Appl. No.: 13/696,117

(22) PCT Filed: May 2, 2011

(86) PCT No.: PCT/AT2011/000209
§ 371 (c)(1),
(2), (4) Date: Jan. 22, 2013

(87) PCT Pub. No.: WO2011/137472
PCT Pub. Date: Nov. 10, 2011

(65) Prior Publication Data
US 2013/0233705 A1 Sep. 12, 2013

(30) Foreign Application Priority Data
May 4, 2010 (AT) ................. GM288/2010

(51) Int. Cl.
C23C 14/34 (2006.01)
B22F 3/15 (2006.01)
C23C 14/06 (2006.01)
(Continued)

(52) U.S. Cl.
CPC ............ *C23C 14/067* (2013.01); *B22F 3/15* (2013.01); *C04B 35/58071* (2013.01); *C22C 1/1084* (2013.01); *C23C 14/3414* (2013.01); *C04B 2235/3813* (2013.01); *C04B 2235/5436* (2013.01)

(58) Field of Classification Search
CPC ............ B22F 3/15; C04B 35/58071; C04B 2235/3813; C04B 2235/5436; C22C 1/1084; C23C 14/067; C23C 14/3414
USPC ....................... 204/298.12, 298.13
See application file for complete search history.

(56) References Cited

U.S. PATENT DOCUMENTS

| 4,209,375 A | 6/1980 | Gates et al. |
| 4,925,346 A | 5/1990 | Moskowitz et al. |

(Continued)

FOREIGN PATENT DOCUMENTS

| JP | S4325806 Y1 | 10/1968 |
| JP | 64-042575 | 2/1989 |
| JP | 1042575 A | 2/1989 |

(Continued)

OTHER PUBLICATIONS

Machine Translation JP 07-082029 dated Mar. 1995.*
(Continued)

*Primary Examiner* — Rodney McDonald
(74) *Attorney, Agent, or Firm* — Laurence A. Greenberg; Werner H. Stemer; Ralph E. Locher

(57) ABSTRACT

A titanium diboride target contains fractions of one or more metals from the group including iron, nickel, cobalt and chromium as well as carbon. The mean grain size of $TiB_2$ grains is between 1 μm and 20 μm, the carbon content is in a range of 0.1 to 5% by weight and the total content of Fe, Ni, Co and/or Cr is in a range of 500 to 3,000 μg/g. The carbon is distributed in free form at the grain boundaries of the $TiB_2$ grains in such a way that mean distances between individual carbon particles are less than 20 μm. The porosity is less than 5% by volume.

7 Claims, 1 Drawing Sheet

(51) Int. Cl.
*C04B 35/58* (2006.01)
*C22C 1/10* (2006.01)

(56) References Cited

U.S. PATENT DOCUMENTS 5,045,269 A 9/1991 Sara
5,372,979 A 12/1994 Sigl et al.

FOREIGN PATENT DOCUMENTS

| JP | 64042575 U | 3/1989 |
| JP | H02229767 A | 9/1990 |
| JP | H05195199 A | 8/1993 |
| JP | 6248446 A | 9/1994 |
| JP | H0782029 A | 3/1995 |
| JP | H07109173 A | 4/1995 |
| JP | 2000226648 A | 8/2000 |
| RU | 2017846 C1 | 8/1994 |
| RU | 2305717 C2 | 9/2007 |

OTHER PUBLICATIONS

Machine Translation JP 06-248446 dated Sep. 1994.*
Xiang Xing et al., "Development of Research on TiB2 and Its Composites", Journal of Ceramics, vol. 20, No. 2, Jun. 30, 1999, pp. 112-117—English abstract.
Miao Mingqing et al., "Microstructure and Mechanical Properties of TiB2 Cermet", Acta Materiae Compositae Sinica, vol. 22, No. 1, Feb. 28, 2005, pp. 64-67—English abstract.
International Search Report of PCT/AT2011/000209.
Knotek, O., et al., "Ceramic cathodes for arc-physical vapour deposition: development and application", Surface and Coatings Technology, 1991, pp. 263-267, vol. 49, Issue No. 1-3.

* cited by examiner

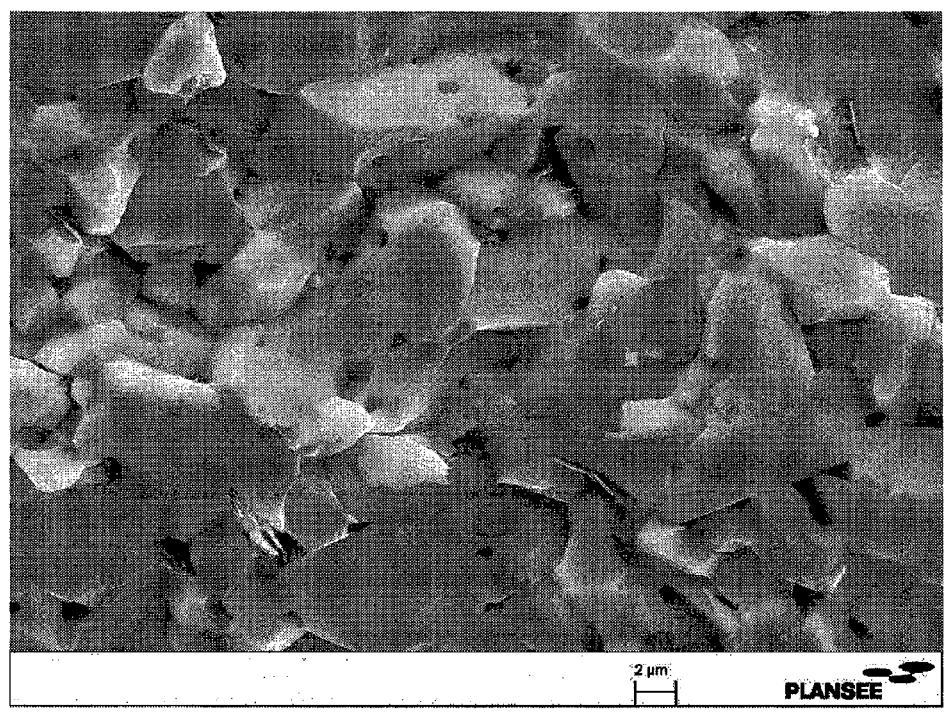

TITANIUM DIBORIDE TARGET

BACKGROUND OF THE INVENTION

Field of the Invention

The invention relates to a titanium diboride target for physical vapor deposition that comprises fractions of one or more metals from the group consisting of iron, nickel, cobalt, and chromium, and also comprises carbon.

PVD (physical vapor deposition) processes are coating processes wherein the coating is generated by physical means, by evaporation of the coat-forming particles from a target, condensation of the vapor, and coat formation on the substrate to be coated.

In view of the lower coating temperature and the generally lower process costs by comparison with CVD (chemical vapor deposition) processes, PVD processes are being used increasingly also for the production of hard material coats on tools for machine cutting or on wearing parts.

Among the various PVD processes, particular significance in practice has been acquired more particularly by cathode sputtering processes, in which the target is atomized by ion bombardment and converted to the vapor phase, or by ARC-PVD processes, where atoms and ions are converted to the vapor phase from the evaporation source by electrical discharge in the form of an arc load.

The target here is always the source of the material to be evaporated, and is then installed into the coating unit directly or via a cathode mount, depending on the nature of the PVD process. For the ARC-PVD process, in particular, temperature distribution is very often improved by providing the targets with a cooling plate on their reverse, this plate either being in form-fitting contact with the target, with effective thermal conduction, or else being joined fusionally to the target, by means of a suitable bonding process.

The ARC-PVD process has the advantage over the cathode sputtering process that higher ionization rates and also higher deposition rates are achieved.

The process, as a result, becomes more economical, process control is improved, and, as a result of the higher energetic growth conditions, it becomes possible to exert a positive influence on the coat structure.

Titanium diboride coats, which are used frequently, on account of their high hardness and, in particular, good wear resistance, as hard material coats which come into contact with nonferrous metals, however, are very difficult to produce by means of ARC-PVD processes. The thermal shock resistance of titanium diboride is low. Since the arc of light in the ARC-PVD process means that the target can be evaporated only within very narrowly confined spatial and temporal zones, these properties of titanium diboride result in large thermal stresses, as a result of which the target may be prematurely destroyed.

The literature reference "Ceramic cathodes for arc-physical vapour deposition: development and application", O. Knotek, F. Löffler, Surface and coating technology 49 (1991), pages 263 to 267, describes the production of titanium diboride ARC targets by HIPing (hot isostatic pressing) of pure titanium diboride powders, which are provided with less than 1% by weight of various metallic additions such as aluminum and nickel and also metalloid additions such as boron and carbon, and also the production of titanium diboride coats using these ARC evaporation sources.

Among the conclusions from the experiments it is said in particular that the application of the HIP (hot isostatic pressing) process is important for the production of titanium diboride targets, in order to allow coatings to be produced by the ARC-PVD process.

The titanium diboride targets produced in this way, however, still do not have the necessary thermal shock resistance that would be needed for an ARC-PVD coating process to function smoothly in practice.

BRIEF SUMMARY OF THE INVENTION

It is an object of the present invention, therefore, to provide a titanium diboride target which can be used without problems in practice for the ARC coating process as well.

In accordance with the invention, this is achieved in that the average grain size of the titanium diboride grains is between 1 μm and 20 μm, the carbon content is in a range from 0.1% to 5% by weight, the total amount of iron, nickel, cobalt and/or chromium is in the range from 500 to 3000 μg/g, and the carbon is distributed in free form at the grain boundaries of the titanium diboride grains such that the average distances between the individual carbon particles are less than 20 μm, and in that the porosity is less than 5% by volume.

It is important here that at least one of the stated metallic components is present within the stated range, it also being possible, of course, for further, low-melting metallic components to be present, such as copper or aluminum, but they never on their own obtain the desired effect.

The average grain size of the titanium diboride grains is determined by the laser diffraction process.

It is particularly advantageous here if the carbon content is in a range from 0.5% to 3% by weight, iron is present as metallic component in the range from 1000 to 2000 μg/g, and the average grain size of the $TiB_2$ grains is between 2 μm and 10 μm.

By virtue of the present invention it has been found that, by means of a completely uniform carbon distribution and distribution of the metallic additions within the stated ranges, titanium diboride targets are produced which can be vaporized without problems even by the ARC-PVD process, without thermal stresses causing local or complete disintegration of the target.

This is achieved in that a starting powder mixture of $TiB_2$ powder and graphite powder is ground in a grinding assembly with grinding beads which comprise one or more metals from the group consisting of Fe, Ni, Co, and Cr until the total amount of Fe, Ni, Co and/or Cr is in the range from 500 to 3000 μg/g, and in that the compaction of the fully ground powder mixture takes place by hot pressing, at a pressing pressure in the range from 10 MPa to 40 MPa and at a temperature in the range from 1600° C. to 2000° C.

It is important here that the metallic fractions are not added as powder, but are instead introduced merely as abraded material via the grinding beads which comprise at least one of the listed metals.

The method is particularly advantageous when the starting powder mixture of $TiB_2$ powder and graphite powder is ground in an attritor with iron grinding beads until the iron content is in the range from 500 to 3000 μg/g, and the compaction of the ground powder mixture takes place by hot pressing, at a pressing pressure in the range from 25 to 35 MPa and at a temperature in the range from 1650° C. and 1850° C.

The grinding operation serves essentially for uniform distribution of the carbon and of the metallic components. Customary grinding times with which the metallic additions are brought within the specified range are situated within an order of magnitude of 10 to 120 minutes, depending on the type of mill used. Particularly rapid incorporation is achieved through the use of an attritor as the mill.

Another very decisive factor for the production of the targets is that the compaction of the fully ground powder mixture is accomplished not by an HIP process but instead by hot pressing within the stated pressing pressures and temperatures. As a result of this there is no need for the containment of the starting powder mixture, as is necessary with the HIP process for the application of the isostatic pressing pressure, with the result that the process becomes more cost-effective and in particular that internal stresses in the compacted target are avoided; in the case of the HIP process, owing to the very different thermal expansion coefficients of containment material and titanium diboride, such stresses would occur.

For the purposes of the present invention, the term "hot pressing" is to include all variant forms of hot pressing, with or without direct current transit, such as, for example, the SPS (spark plasma sintering) process or the FAST (field assisted sintering technology) process.

The invention is illustrated below with reference to production examples and figures.

Example 1

For purposes of experimentation, a roundel-shaped target with a diameter of 60 mm and a thickness of 8 mm was produced in accordance with the invention.

The starting material used was a titanium diboride powder having a boron content of 30.88% by weight, an iron content of 0.023% by weight, a carbon content of 0.020% by weight, the remainder being titanium, and an average grain size d50 of 2.39 µm.

In a pot mixer, 1980 g of this titanium diboride powder were ground for 2 hours, with addition of 20 g of graphite and 2000 g of isopropanol, using 8000 g of steel balls having a diameter of 15 mm. The powder mixture was subsequently dried by evaporation of the alcohol. Chemical analysis gave an iron content of 0.154% by weight, corresponding to 1540 µg/g, and a carbon content of 1.0% by weight in the powder mixture.

The powder mixture was subsequently compacted in a hot press, using graphite tools, with a maximum pressing pressure of 30 MPa and a maximum temperature of 1830° C., for a holding time of 40 minutes, to give a roundel having a diameter of 60 mm and a thickness of 8 mm.

As a result of the hot pressing, a density of the material of 4.4 g/cm$^3$ was reached, corresponding to 98% of the theoretical density.

BRIEF DESCRIPTION OF THE SEVERAL VIEWS OF THE DRAWING

FIG. 1 shows the scanning electron micrograph of the microstructure of a fracture surface of a target of the invention at 2500 times magnification.

DESCRIPTION OF THE INVENTION

Clearly visible from the micrograph are the dark-colored, lamellar graphite particles at the grain boundaries of the TiB$_2$ grains, with average distances from one another in the order of magnitude of 10 µm. Additionally visible is the high density of the microstructure, with a very low porosity.

Example 2

For purposes of comparison, a target was produced having the same dimensions as in Example 1, with similar production parameters, but not in accordance with the invention—without addition of carbon.

The starting material used was a titanium diboride powder having a boron content of 31.71% by weight, an iron content of 0.032% by weight, a carbon content of 0.044% by weight, the remainder being titanium, and an average grain size d50 of 4.48 µm.

In a pot mixer, 200 g of this titanium diboride powder were ground for 3 hours, with addition of 200 g of isopropanol, using 800 g of steel balls having a diameter of 15 mm.

The powder was subsequently dried by evaporation of the alcohol. Chemical analysis gave an iron content of 0.119% by weight, corresponding to 1190 µg/g, and a carbon content of 0.050% by weight.

The powder was subsequently compacted in a hot press, with a maximum pressing pressure of 30 MPa and a maximum temperature of 1800° C., for a holding time of 20 minutes.

As a result of the hot pressing, a density of the material of 4.4 g/cm$^3$ was reached, corresponding to 98% of the theoretical density.

Example 3

For purposes of comparison, two targets were produced having the same dimensions as in Example 1, with similar production parameters, but not in accordance with the invention—without addition of carbon and without grinding of the starting powder.

The starting material used was a titanium diboride powder having a boron content of 31.4% by weight, an iron content of 0.028% by weight, a carbon content of 0.042% by weight, the remainder being titanium, and an average grain size d50 of 3.81 µm.

The starting powder was subsequently compacted in a hot press, once with a maximum pressure of 30 MPa and a maximum temperature of 1800° C., with a holding time of 60 minutes, and once with a maximum pressing pressure of 30 MPa and a maximum temperature of 2200° C., with a holding time of 30 minutes.

In the first case, the hot pressing produced a target having a density of the material of 3.3 g/cm$^3$, corresponding to 73% of the theoretical density, and in the second case a target having a density of the material of 3.4 g/cm$^3$ was attained, corresponding to 76% of the theoretical density.

For comparative experiments, the targets produced according to Examples 1 and 2 were installed into a molybdenum cathode holder with a graphite sheet for thermal contacting.

The corresponding cathodes were then investigated for their behavior in an ARC-PVD unit, with the following coating parameters:
ARC current 60-70 A
voltage 21 V
chamber temperature 24° C.
operating pressure 1.5 Pa argon.

On account of their low density, the targets produced according to Example 3 were destroyed while still being machined for installation into the cathode holder, and could therefore not be used.

In a 60-minute operation, the target produced in accordance with the invention, according to Example 1, behaved stably. The target showed no cracks at all and exhibited a smooth surface depleted in thickness by 1 to 2 mm.

The target produced not in accordance with the invention, according to Example 2, had cracked after just a few minutes of operation, and shortly thereafter was completely destroyed.

The targets produced according to comparative examples 2 and 3 show clearly that not only the addition of carbon but also the uniform distribution of small fractions of iron, which are introduced into the starting powder exclusively through the abraded material during grinding, are necessary in order to ensure good functionality of the targets.

The invention is by no means limited to the production examples described. Thus, in particular, targets are also included which have been unified fusionally by a bonding process with a cooling plate made, for example, of molybdenum.

The invention claimed is:

1. A titanium diboride target for physical vapor deposition, the titanium diboride target comprising:
    fractions of one or more metals selected from the group consisting of iron, nickel, cobalt, chromium and carbon;
    $TiB_2$ grains with an average grain size of between 1 μm and 20 μm;
    a carbon content in a range from 0.1% to 5% by weight;
    a total content of Fe, Ni, Co and/or Cr in a range from 500 to 3,000 μg/g;
    at least part of the carbon being distributed in free form at grain boundaries of the $TiB_2$ grains; and
    a porosity of less than 5% by volume.

2. The titanium diboride target according to claim 1, wherein the carbon content is in a range from 0.5% to 3% by weight.

3. The titanium diboride target according to claim 1, wherein the average grain size of the $TiB_2$ grains is between 2 μm and 10 μm.

4. The titanium diboride target according to claim 1, which comprises an Fe content in a range from 1,000 to 2,000 μg/g.

5. The titanium diboride target according to claim 1, which comprises defining average distances between individual carbon particles of less than 20 μm.

6. A method for producing a titanium diboride target, the method comprising the following steps:
    grinding a starting powder mixture of $TiB_2$ powder and graphite powder in a grinding assembly with grinding beads containing one or more metals selected from the group consisting of Fe, Ni, Co and Cr until a total amount of Fe, Ni, Co and/or Cr is in a range from 500 to 3,000 μg/g; and
    compacting the fully ground powder mixture by hot pressing at a pressing pressure in a range from 10 MPa to 40 MPa and at a temperature in a range from 1,600° C. to 2,000° C., to produce a titanium diboride target including:
        fractions of one or more metals selected from the group consisting of iron, nickel, cobalt, chromium and carbon;
        $TiB_2$ grains with an average grain size of between 1 μm and 20 μm;
        a carbon content in a range from 0.1% to 5% by weight;
        a total content of Fe, Ni, Co and/or Cr in a range from 500 to 3,000 μg/g;
        at least part of the carbon being distributed in free form at grain boundaries of the $TiB_2$ grains; and
        a porosity of less than 5% by volume.

7. A method for producing a titanium diboride target, the method comprising the following steps:
    grinding a starting powder mixture of $TiB_2$ powder and graphite powder in an attritor with iron grinding beads until an iron content is in a range from 1,000 to 2,000 μg/g; and
    compacting the ground powder mixture by hot pressing at a pressing pressure in a range from 25 to 35 MPa and at a temperature in a range of 1,600° C. to 1,850° C., to produce a titanium diboride target including:
        fractions of one or more metals selected from the group consisting of iron, nickel, cobalt, chromium and carbon;
        $TiB_2$ grains with an average grain size of between 1 μm and 20 μm;
        a carbon content in a range from 0.1% to 5% by weight;
        a total content of Fe, Ni, Co and/or Cr in a range from 500 to 3,000 μg/g;
        at least part of the carbon being distributed in free form at grain boundaries of the $TiB_2$ grains;
    a porosity of less than 5% by volume; and
    an Fe content in a range from 1,000 to 2,000 μg/g.

* * * * *